(12) United States Patent
Van Zyl et al.

(10) Patent No.: US 8,330,432 B2
(45) Date of Patent: Dec. 11, 2012

(54) EFFICIENT ACTIVE SOURCE IMPEDANCE MODIFICATION OF A POWER AMPLIFIER

(75) Inventors: Gideon Van Zyl, Fort Collins, CO (US); John Dorrenbacher, Fort Collins, CO (US)

(73) Assignee: Advanced Energy Industries, Inc, Fort Collins, CO (US)

( * ) Notice: Subject to any disclaimer, the term of this patent is extended or adjusted under 35 U.S.C. 154(b) by 541 days.

(21) Appl. No.: 12/645,285

(22) Filed: Dec. 22, 2009

(65) Prior Publication Data

US 2011/0148303 A1      Jun. 23, 2011

(51) Int. Cl.
*H02P 9/30* (2006.01)
(52) U.S. Cl. ............................................. 322/36; 322/37
(58) Field of Classification Search ...................... 322/23, 322/24, 28, 36, 37, 59
See application file for complete search history.

(56) References Cited

U.S. PATENT DOCUMENTS

| | | | |
|---|---|---|---|
| 5,300,876 A * | 4/1994 | Takagi ............................ | 322/58 |
| 5,448,167 A * | 9/1995 | Takagi ........................... | 324/177 |
| 5,712,592 A | 1/1998 | Stimson et al. | |
| 6,794,855 B2 * | 9/2004 | Shimomura et al. ............ | 322/59 |
| 7,570,028 B2 * | 8/2009 | van Zyl ........................... | 322/36 |
| 7,970,562 B2 * | 6/2011 | van Zyl ........................... | 702/60 |
| 8,004,251 B2 * | 8/2011 | van Zyl ........................... | 322/36 |

OTHER PUBLICATIONS

Mitrovic, Bayer, "International Search Report and Written Opinion re Application No. PCT/US2010/061351", Mar. 21, 2011, Published in: AU.

Sing, B., et al., "A Review of Active Filters for Power Quality Improvement", "IEEE Transactions on Industrial Electronics", Oct. 5, 1999, pp. 960-971, vol. 46, No. 5, Publisher: IEEE, Published in: US.

* cited by examiner

*Primary Examiner* — Nicholas Ponomarenko
(74) *Attorney, Agent, or Firm* — Neugeboren O'Dowd PC

(57) ABSTRACT

A system, method, and apparatus for stabilizing interactions between an electrical generator and a nonlinear load are described. One illustrative embodiment includes an impedance element that is coupled to an output of the generator and a power source coupled to the impedance element. The power source applies power to, or across, the impedance element so as to reduce energy loss that would ordinarily occur due to energy dissipation by way of the impedance element. In many variations, the power source operates within a defined bandwidth so that a stabilizing effect is achieved outside of this bandwidth.

18 Claims, 6 Drawing Sheets

EFFICIENT ACTIVE SOURCE IMPEDANCE MODIFICATION OF A POWER AMPLIFIER

FIELD OF THE INVENTION

The present invention relates generally to electrical generators. In particular, but not by way of limitation, the present invention relates to methods and apparatuses for controlling a source impedance of generators such as are used with plasma processing chambers.

BACKGROUND OF THE INVENTION

Very often sensitivity of a power amplifier's power output to the impedance of a non-linear load (such as a plasma load) connected to the output of the amplifier gives rise to system instabilities. A common, but not exclusive, method to control the source impedance of a power amplifier to reduce system instabilities is to use a balanced amplifier configuration, as described by K. Kurokawa, "Design theory of balanced transistor amplifiers", Bell System Technical Journal, October 1965, to apply power to a load.

If the source impedance of the individual amplifiers used in the balanced amplifier configuration is close to the desired output impedance, no substantial penalty is paid for using such a balanced amplifier, however in this case there is no need to use a balanced amplifier configuration to restore the generator source impedance. Many common amplifier technologies, however, such as class D and E amplifiers, have a source impedance that is very different from the desired output impedance. In such a case, a large fraction of the reflected power from a load connected to the output of the balanced amplifier is dissipated in a terminating resistor of an output hybrid of the balanced amplifier. In addition, the individual amplifiers experience larger excursions in the impedance into which they deliver power than the excursion of the load impedance itself. This means that when two amplifiers are combined in a balanced amplifier configuration, the power delivery capability into load impedances different from the nominal load impedance (typically 50 ohm) is typically not much better than that of a single amplifier of the same type.

In industrial applications, it is common to accept reflected power equal to 20% of the output capability of an amplifier, which puts strain on the on the design of the hybrid combiner terminating resistor and individual amplifiers and often limits the voltage-current capability of the balanced amplifier.

It is thus apparent that there is a need in the art for an improved method and apparatus for modifying the output impedance of a generator to a desired value without having to dissipate power in a dump resistor and without needing almost double the power capability compared to a single amplifier configuration to ensure good power delivery into non-standard load impedances

SUMMARY OF THE INVENTION

Illustrative embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents, and alternative constructions that fall within the spirit and scope of the invention as expressed in the claims.

In one embodiment, the invention may be characterized as a system for stabilizing power that is applied from a generator to a non-linear load. The system in this embodiment includes an impedance element coupled to an output of the generator and a power source coupled to the impedance element at a first node and arranged in series with the impedance element so that the impedance element is disposed between the output of the generator and the power source. The impedance element and the power source create a series combination that is in parallel with the generator, and the power source applies a voltage to the first node that is substantially the same as a voltage at the output of the generator so as to reduce power dissipated in the impedance element.

In accordance with another embodiment, the invention may be characterized as a method for stabilizing an interaction between a generator and a non-linear load. The method includes placing an impedance element between an output of the generator and a power source so that the source impedance of the generator in parallel with the impedance element in series with the power source, is substantially the same as the non-linear load impedance, and adjusting the power source output so as to reduce the power dissipated by the impedance.

These and other embodiments are described in further detail herein.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings, wherein:

DETAILED DESCRIPTION

Figure 1:
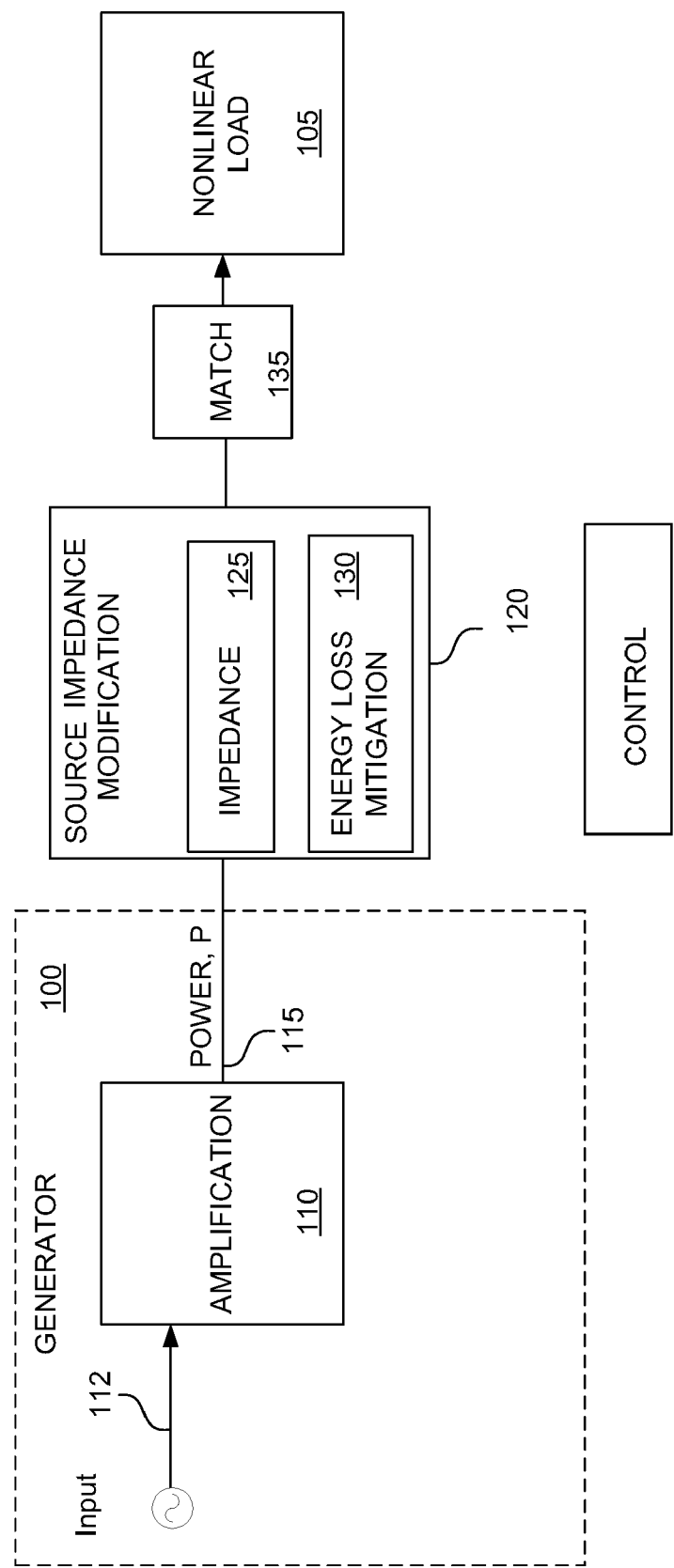
FIG. 1 is a block diagram depicting components of an exemplary system in accordance with the present invention.

An understanding of various embodiments of the invention is aided by an analysis of how instability in the output power of an electrical generator can occur as a result of interactions between the generator and the impedance of a nonlinear load with which it is connected. FIG. 1 is a block diagram of a generator 100 connected with a nonlinear load 105 to facilitate such an analysis while depicting an exemplary embodiment of the invention. Generator 100 includes an amplification component 110, which delivers, responsive to a control input 112, output power P 115 to the nonlinear load 105. Nonlinear load 105 in turn presents a load impedance $Z_L$ that includes real and imaginary components of which are, respectively, resistance R and reactance X. That is, $Z_L = R_L + jX_L$.

In one embodiment, generator 100 is a radio-frequency (RF) generator, and nonlinear load 105 includes a plasma, which can be used in, for example, vapor deposition and etching applications.

As discussed further herein, the amplification component 110 may be realized with a variety of topologies, but with any alternating current or radio frequency (RF) power amplifier topology, an effective Thevenin equivalent source impedance can be associated that predicts how the output power of the generator 100 will behave when the load 105 impedance $Z_L$ is changed. Very often, sensitivity of the power amplifier's 110 power output to the impedance $Z_L$ of the nonlinear load 105 (e.g., a plasma load) that is connected to the output of the amplification component 110 gives rise to system instabilities. It has been found, however, that when the source impedance (as defined in the way described infra) is substantially equal to the impedance $Z_L$ of the nonlinear load 105, the sensitivity, and thus, the probability of system instabilities is reduced.

An effective source impedance of the amplification component 110 operating into the load impedance $Z_L$ may be defined as a Thevenin equivalent impedance of a Thevenin equivalent source that matches the change in power of the generator 100 as the load impedance $Z_L$ is changed slightly from its nominal value with the control input 112 to the amplification component 110 held fixed if the generator 100 is replaced by this Thevenin equivalent source.

For small changes in $Z_L$, the change in the amplification component's output power P is approximated by the equation:

$$P = P_o + \frac{\partial P}{\partial R}\Delta R_L + \frac{\partial P}{\partial X}\Delta X_L$$

where $P_o$ is the output power of the amplification component 110 (with a given fixed control input) into $$Z_L, \frac{\partial P}{\partial R}$$

is the sensitivity of the output power of the amplification component 110 to change in the real part of $Z_L$ at $Z_L$, and at the given fixed control input, $$\frac{\partial P}{\partial X}$$

is the sensitivity of the output of the amplification component 110 to the imaginary part of the load impedance at $Z_L$ at the given fixed control input, $\Delta R_L$ is the change in the real part of $Z_L$ and $\Delta X_L$ is the change in the imaginary part of $Z_L$. Of course, assuming reasonable behavior of P as $Z_L$ is changed, this approximation can be made as precise as desired by making $\Delta R_L$ and $\Delta X_L$ small.

A Thevenin equivalent source with Thevenin equivalent voltage $v_s$, and Thevenin equivalent source impedance $Z_s = R_s + jX_s$ will deliver power $$P_1 = \frac{|v_s|^2}{(R_s + R_L)^2 + (X_s + X_L)^2} R_L$$

into a load $Z_L = R_L + jX_L$, power $$P_2 = \frac{|v_s|^2}{(R_s + R_L + \Delta R_L)^2 + (X_s + X_L)^2}(R_L + \Delta R_L)$$

into a load $Z_L + \Delta R_L = (R_L + \Delta R_L) + jX_L$, and power $$P_3 = \frac{|v_s|^2}{(R_s + R_L)^2 + (X_s + X_L + \Delta X_L)^2} R_L$$

into a load $Z_L + j\Delta X_L = R_L + j(X_L + \Delta X_L)$.

To match the Thevenin equivalent source with the behavior of the amplifier, the following equations hold true:

$$P_0 = \frac{|v_s|^2}{(R_s + R_L)^2 + (X_s + X_L)^2} R_L$$

$$P_o + \frac{\partial P}{\partial R}\Delta R_L = \frac{|v_s|^2}{(R_s + R_L + \Delta R_L)^2 + (X_s + X_L)^2}(R_L + \Delta R_L)$$

$$P_o + \frac{\partial P}{\partial X}\Delta X_L = \frac{|v_s|^2}{(R_s + R_L)^2 + (X_s + X_L + \Delta X_L)^2}(R_L)$$

Given $P_O$, $$\frac{\partial P}{\partial R},$$

and $$\frac{\partial P}{\partial X},$$

the set of three equations can be solved for $v_s$, $R_s$, and $X_s$ yielding the desired Thevenin equivalent source impedance that matches the behavior of the amplifier for small changes in $Z_L$ from its nominal value and for the given control input to the amplifier.

For example, with $$a = R_L$$
$$b = X_L$$
$$c = -\frac{R_L}{P_o}$$
$$d = 2P_o$$
$$e = \frac{\partial P}{\partial R}\frac{R_L}{P_o} - 1, \text{ and}$$
$$f = \frac{\partial P}{\partial X}\frac{R}{P_o}$$

it is found that:

$$R_s = \frac{cde}{f^2 + e^2} - a$$

$$X_s = \frac{cdf}{f^2 + e^2} - b$$

$$|v_s|^2 = -\frac{cd^2}{f^2 + e^2}$$

As a consequence, an equivalent Thevenin source impedance can be assigned that predicts the behavior of the delivered power of the amplification portion 110 as the impedance $Z_L$ of the load 105 is varied, and it has been found that for many variations of the amplification portion 110, the Thevenin equivalent model predicts the delivered power correctly over a wide range of load impedance and remains relatively constant over a wide range of control inputs.

As shown in FIG. 1, a source impedance modification component 120 is depicted, which includes an impedance portion 125 and an energy loss mitigation portion 130. In general, the source impedance modification component 120 operates to modify the source impedance of the generator (which may include impedance transformation by a cable connecting the generator 100 to the impedance modification component 120) while reducing energy dissipation that typically occurs when the source impedance of the generator 100 departs from a desired source impedance.

The illustrated arrangement of these components is logical and not meant to be an actual hardware diagram. Thus, the components can be combined or further separated in an actual implementation. For example, the source impedance modification component 120 may be implemented within a housing of the generator and may share some components (e.g., control logic components) with the generator 100. In yet other embodiments, the source impedance modification component 120 may be implemented within a housing of the match 135. Moreover, the construction of each individual component, in light of this specification, is well-known to those of skill in the art.

In general, the impedance portion 125 functions to provide additional impedance to the source impedance of the generator 100 so that the combined source impedance of the generator 100 and the impedance 125 is at, or close to, a desired impedance (e.g., the impedance of the load 105 as transformed by the match 135). In many implementations, the desired source impedance is 50 Ohms, but this is certainly not required and in other implementations the desired source impedance includes impedances other than 50 Ohms. The impedance 125 may include impedance elements (e.g., resistive, inductive, and/or capacitive components) that are in series with the generator 100, in parallel with the generator 100, or it may include impedance elements both in series and in parallel with the generator 100. And in some implementations a fixed or variable length of cable, filter or impedance matching component may be installed between the generator 100 and source impedance modification component 120.

The energy loss mitigation component 130 generally functions to reduce energy loss (due to current flowing through one or more of the impedance elements that make up the impedance component 125) that would ordinarily occur. In several embodiments, for example, the energy loss mitigation component 130 applies power to, or across, one or more of the impedance elements within the impedance component 125 to reduce energy dissipation by the impedance component 125.

As discussed further herein, in many implementations, the power that the energy loss mitigation component 130 applies to the impedance component 125 is modulated in terms of one or more of magnitude, phase, and frequency to alter (e.g., minimize) energy dissipation by way of the impedance component 125. Although modulating all three of the magnitude, phase, and frequency may be most effective to reduce energy dissipation, it is contemplated that energy dissipation may be effectuated by modulating only one or two of the magnitude, phase, and frequency of the power that is applied to the impedance component 125.

As discussed further herein, the energy mitigation component 130 may be realized by a voltage source, a current source, or a power source with a finite output impedance or combinations that are alternately engaged depending upon the generator 100 source impedance relative to the desired source impedance.

In some implementations, the power that is applied by the energy loss mitigation component 130 is modulated based upon calculations that are a function of the power delivered into the load. For example, if it is known that the phase shift between a reference oscillator and generator output voltage when delivering 1 kW into 50 ohm is a 30 degree delay, the voltage source 230 may be set to 316V amplitude, and also delayed 30 degrees with respect to the reference oscillator. In other cases voltage source 230 may be commanded to match the measured generator output voltage rather than a calculated voltage.

In other implementations, as discussed further herein, the energy loss mitigation component 130 utilizes a feedback loop so that the voltage and/or current and/or combinations thereof output by the generator 100 are used to control modulation of power to the impedance portion 125.

In several modes of operation, the energy loss mitigation portion 130, by default, does not continuously change the power to the impedance component 125, and only changes the power applied to the impedance component 125 in connection with changes in the impedance of the load 105. For example, for low frequency stabilization, a feedback control system ((not shown) e.g., using feedback indicative of one or more attributes such as voltage, current, power, reflection coefficients obtained from one or more transducers that are coupled at the output of the generator) may be utilized to adjust the power of the energy loss mitigation component only if the power dissipation in the impedance element 125 exceeds a certain threshold. In some, typically low power, applications the energy loss mitigation component may be disabled totally and the power loss by the impedance element 125 simply accepted and compensated for by the generator 100. In yet other applications, the energy loss mitigation element may take the form of a switch that enables the impedance element 125 to modify the source impedance at low power, but disables the impedance element at high power.

By way of further example, the energy loss mitigation component 130 in many implementations operates within a defined bandwidth so that outside of the defined bandwidth, the energy loss mitigation portion 130 does not affect the impedance of the impedance component 125 (from the perspective of the load 105), and as a consequence, the source impedance remains substantially close to the desired source impedance and system stability is maintained. In other words, outside of one or more defined bandwidths, a desired source impedance is seen.

Although not required, in some embodiments, the amplification component 110 is controlled based upon feedback (not shown) of a measured impedance of the load 105 as disclosed in commonly owned U.S. application Ser. No. 11/740,710 entitled METHOD AND APPARATUS FOR MODIFYING INTERACTIONS BETWEEN AN ELECTRICAL GENERATOR AND A NONLINEAR LOAD, which is incorporated by reference. In these embodiments, it is contemplated that the source impedance modification 120 may stabilize the system at high frequency (outside the control bandwidth of the energy loss mitigation element 130) while the method disclosed in commonly owned U.S. application Ser. No. 11/740,710 takes care of low frequency stabilization.

Figure 2A:
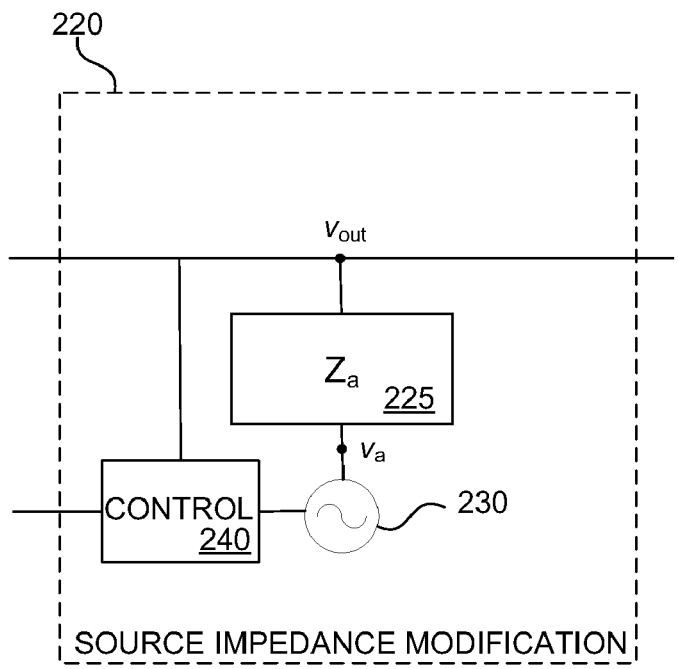
FIGS. 2A and 2B are block diagrams depicting exemplary embodiments of the source impedance modification component depicted in FIG. 1, which include a voltage source and a current source, respectively.
Figure 2B:
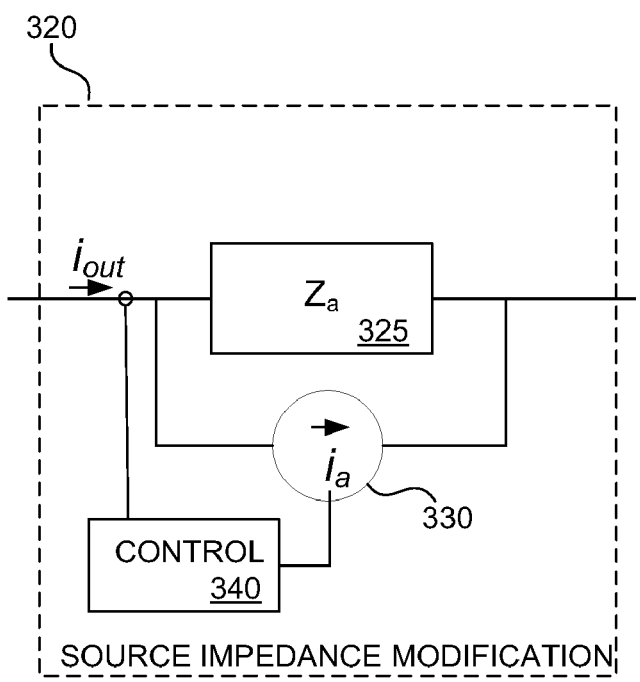

Referring next to FIGS. 2A and 2B, shown are block diagrams depicting exemplary embodiments of the source impedance modification component 120 depicted in FIG. 1. Referring first to FIG. 2A, the energy loss mitigation component 130 described with reference to FIG. 1 is realized by a voltage source 230, and an impedance component 225 is disposed between an output of the generator $v_{out}$ and the voltage source 230 (at node $v_a$).

The impedance component 225 may include resistive, inductive, and/or capacitive elements, and in some variations, the impedance components may be variable impedance elements so as to enable adjustment of the source impedance of the generator. But in many implementations, the impedance elements are fixed and the source impedance of the generator is adjusted by altering the cable length between the generator 100 and the source impedance modification 220.

As shown, in this embodiment the source impedance modification component 220 includes a control portion 240 that is configured to control the voltage $v_a$ so as to reduce a level of energy that is dissipated by the impedance component 225. More specifically, the voltage $v_a$ is controlled based upon feedback of the voltage $v_{out}$ so as to render the voltage $v_a$ substantially the same as $v_{out}$; thus reducing current flowing through the impedance component 225, and as a consequence, energy losses, which are proportional to the square of the current flowing through the impedance component are substantially reduced. In many implementations the voltage $v_a$ is adjusted relatively slowly (e.g., within 10 Hz).

Although not depicted, an analog to digital converter may be utilized to sample $v_{out}$ and provide a digital representation of $v_{out}$ to the control portion 240, which is a logical representation of components used to control the voltage source 230, and is not meant to be an actual hardware diagram. Thus, the control portion 240 can be combined into a unitary component or be realized by distributed components in an actual implementation. In one embodiment, for example, the control portion 240 includes a digital signal processor (DSP) and a field-programmable gate array (FPGA), which includes instructions to effectuate control of the voltage source 230 based upon the digital representation of $v_{out}$ that is processed by the DSP. In other embodiments, the control portion 240 is implemented using a processor that executes firmware or software. In general, the functionality of control portion 240 can be implemented in hardware, firmware, software, or a combination thereof.

In operation, the voltage source 230 is controlled so that, under typical operating conditions (e.g., when the system is stable), the voltage over the impedance component 225 is essentially zero, and the impedance component 225 functions to help stabilize the power that is applied to the load by affecting the source impedance $Z_s$, of the generator—so the source impedance of the combination of the generator and source impedance modification 220 is relatively close to, or at, the desired impedance.

More specifically, if the conductance of the source impedance $G_{thev}$, defined as the real part of $$\left(\frac{1}{Z_s}\right),$$

is less than the desired source conductance $G_{desired}$, defined as the real part of $$\left(\frac{1}{Z_{desired}}\right),$$

the embodiment depicted in FIG. 2A can be used to restore the source impedance of the power amplifier to the desired source impedance $Z_{desired}$ In the embodiment depicted in FIG. 2A, the source impedance will be substantially equal to the desired impedance as long as the impedance $Z_a$ of the impedance component satisfies the following:

$$Z_a = \frac{Z_s Z_{desired}}{Z_s - Z_{desired}}.$$

And the source impedance can be restored without any substantial net power being delivered by the voltage source 230 or dissipated in the load 105 if $v_a = v_{out}$. In the exemplary embodiment depicted in FIG. 2A, the control portion 240 receives feedback indicative of the voltage $v_{out}$ and controls the voltage source 230 so that $v_a$ is substantially equal to $v_{out}$ In alternative embodiments, instead of a feedback loop, the control portion 240 is adapted to calculate what $v_a$ should be for a given power delivered into the load.

In many variations, the bandwidth of the loop that keeps $v_a$ equal to $v_{out}$ is made sufficiently small to achieve a desired stabilization when the sensitivity of the amplification component 110 to changes in the impedance of the load 105 is the cause of the instability. Typically the range of frequencies over which system stability occurs extends from a few kHz to as high as 100 kHz. Using a control bandwidth of a few 100 Hz allows stabilization of many observed system instabilities.

Figure 5:
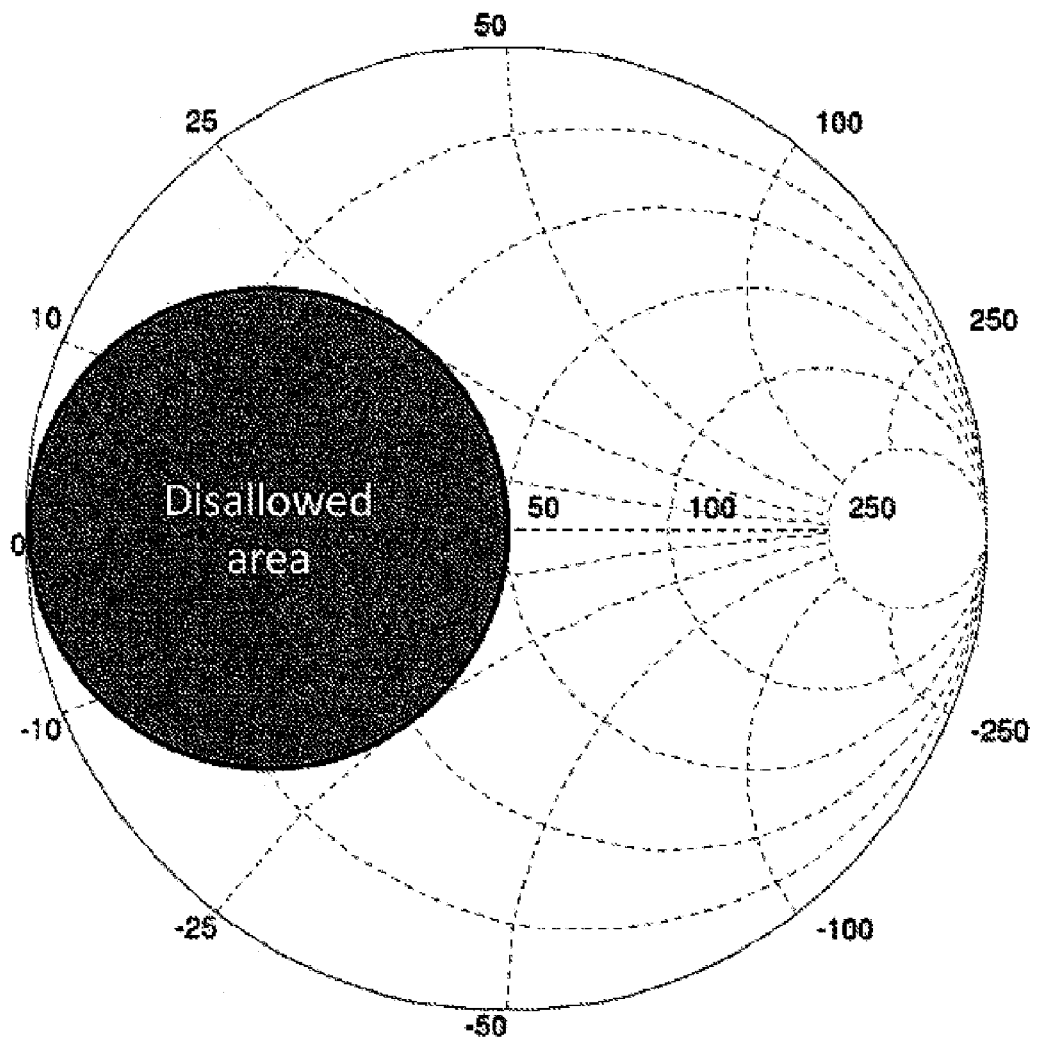
FIG. 5 shows the range of generator source impedances that can be modified to a desired source impedance of 50 ohm using the block diagram of FIG. 2A.

Referring briefly to FIG. 5 for example, the range of Thevenin source impedances for a generator over which the embodiment in FIG. 2A is capable of restoring the source impedance to a desired impedance of 50Ω is shown. As shown in FIG. 5, the rotation of the reflection coefficient by 180 degrees will move any point in the disallowed area to a point in the allowed area so a 50Ω cable between the output of the generator 100 and the source impedance modification 120 of no more than 90 degrees in electrical length at the operating frequency is enough to rotate the generator output impedance so that the embodiment depicted in FIG. 2A may be utilized to restore the source impedance to the desired impedance.

If the impedance Za of the impedance component 225 does not place the source impedance at a desired impedance, a length of coaxial cable (or other form of transmission line or filter) or other similar techniques can be used to rotate the reflection coefficient associated with the source impedance or otherwise transform the source impedance of the amplifier to a desired value. Rotation of the reflection coefficient is a beneficial approach to altering the source impedance because such a transformation will typically leave the power-delivery capability of the amplifier unchanged. The reflection coefficient associated with the source impedance of another amplifier can also be rotated or modified so that its source impedance is close to zero and can be used as the voltage source 230. Any remaining non-zero source impedance of the amplifier and the impedance transformation circuit can be absorbed into the impedance $Z_a$.

The embodiment depicted in FIG. 2B is an alternative approach to realizing the impedance modification component 120 depicted in FIG. 1. This embodiment may be utilized to restore the source impedance to a desired source impedance when the real part of the Thevenin equivalent source impedance is less than the real part of the desired source impedance. As shown, a current source 330 is arranged in parallel with an impedance component 325 and generally functions to reduce energy dissipation in the impedance component (e.g., in one or more selected bandwidths).

More specifically, in the exemplary embodiment, a control portion 340 is disposed and configured to receive an indication of information (e.g., magnitude, phase, and/or frequency) about the current $i_{out}$ (e.g., from a current transducer at the output of the generator 100) and control the current source 330 so that $i_a = i_{out}$. And as described above in connection with FIGS. 1 and 2A, the source impedance modification component 320 in this embodiment may operate so that under typical operating conditions, the current source 330 does not alter the current unless the power loss in the impedance component 325 exceeds a threshold. Alternatively the current source 330 may be controlled within a certain bandwidth, typically between 10 Hz and a few kHz.

Figure 3A:
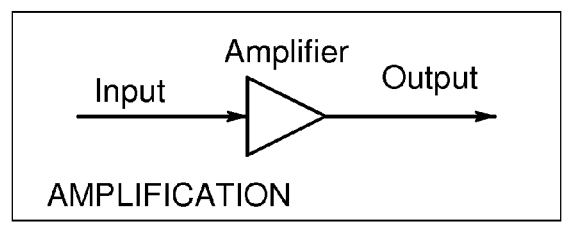
FIGS. 3A and 3B depict embodiments of the amplification component depicted in FIG. 1.
Figure 3B:
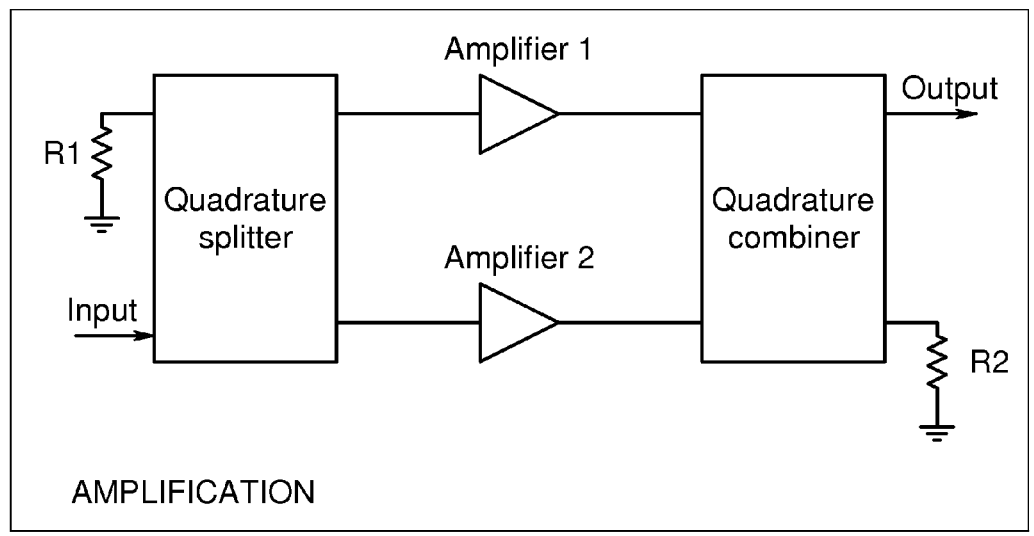

Referring next to FIGS. 3A and 3B, shown are two exemplary embodiments that may be used to realize the amplification component 110 described with reference to FIG. 1. Referring to FIG. 3A, shown is an amplification component that includes a single power amplifier—for example a single RF transistor power amplifier.

FIG. 3B is an amplification component that is configured as a balanced amplifier. The embodiments described with reference to FIGS. 1, 2A, and 2B may incorporate the amplification component depicted in FIG. 3B while preserving the desirable properties of the balanced amplifier without having to dissipate all the power into the terminating resistor $R_2$ when operating into a load that varies from a desired source impedance. For example, in typical implementations that are designed to operate into a 50Ω load, using the amplification component depicted in FIG. 3B in connection with embodiments described with reference to FIGS. 1, 2A, and 2B will enable the balanced amplifier configuration to maintain stability when operating into a load with an impedance that has varied from 50Ω and any dissipation of power into terminating resistor $R_2$ will be reduced (e.g., decreased or eliminated).

In yet alternative embodiments, the power amplification component 110 described with reference to FIG. 1 may be realized by the amplifier disclosed in the above-identified U.S. application Ser. No. 11/740,710, which is designed to operate with feedback that includes information about the impedance of the load.

Figure 4:
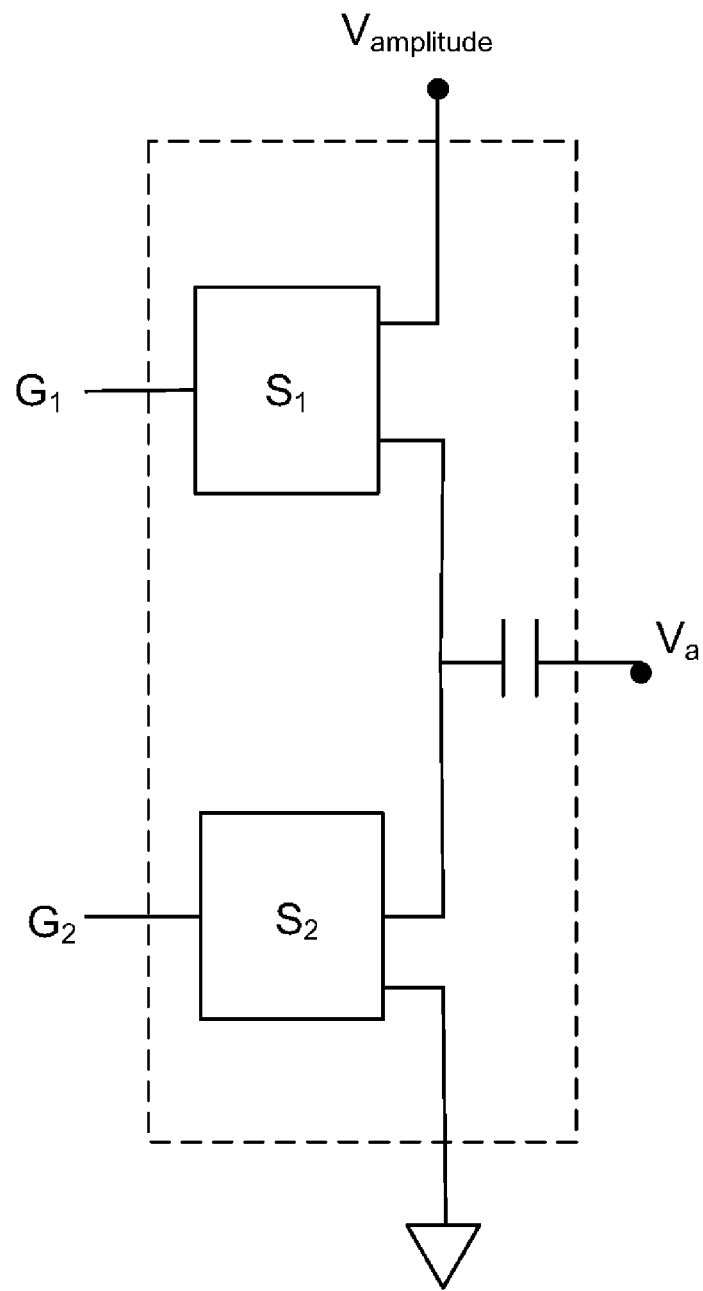
FIG. 4 is a diagram depicting an exemplary embodiment of the voltage source depicted in FIG. 2A.

Referring next to FIG. 4, shown is a block diagram depicting an exemplary embodiment of a voltage source that may be used to realize the voltage source 230 described with reference to FIG. 2A. As shown, the voltage source in this embodiment includes two switching components $S_1$, $S_2$ arranged in a half-bridge configuration to provide a voltage $v_a$ responsive to a voltage applied to a $V_{amplitude}$ node and gate drive signals $G_1$, $G_2$ applied to the switching components $S_1$, $S_2$. In many embodiments, the switching components $S_1$, $S_2$ are realized by field-effect transistors (FETs), but it is contemplated that other existing or future-developed switching technologies may be utilized.

In operation, the voltage $v_{out}$ is monitored (e.g., by control portion 240) and the voltage that is applied to the $V_{amplitude}$ node is modulated so that the amplitude of the voltage $v_a$ is substantially the same as $v_{out}$, and in addition, the signals that are applied to the switching components $S_1$, $S_2$ are timed so that the phase and frequency of the voltage $v_a$ is substantially aligned with $v_{out}$. One of ordinary skill in the art, in light of this disclosure, will appreciate that in alternative embodiments an analog voltage source may be utilized instead.

Figure 6:
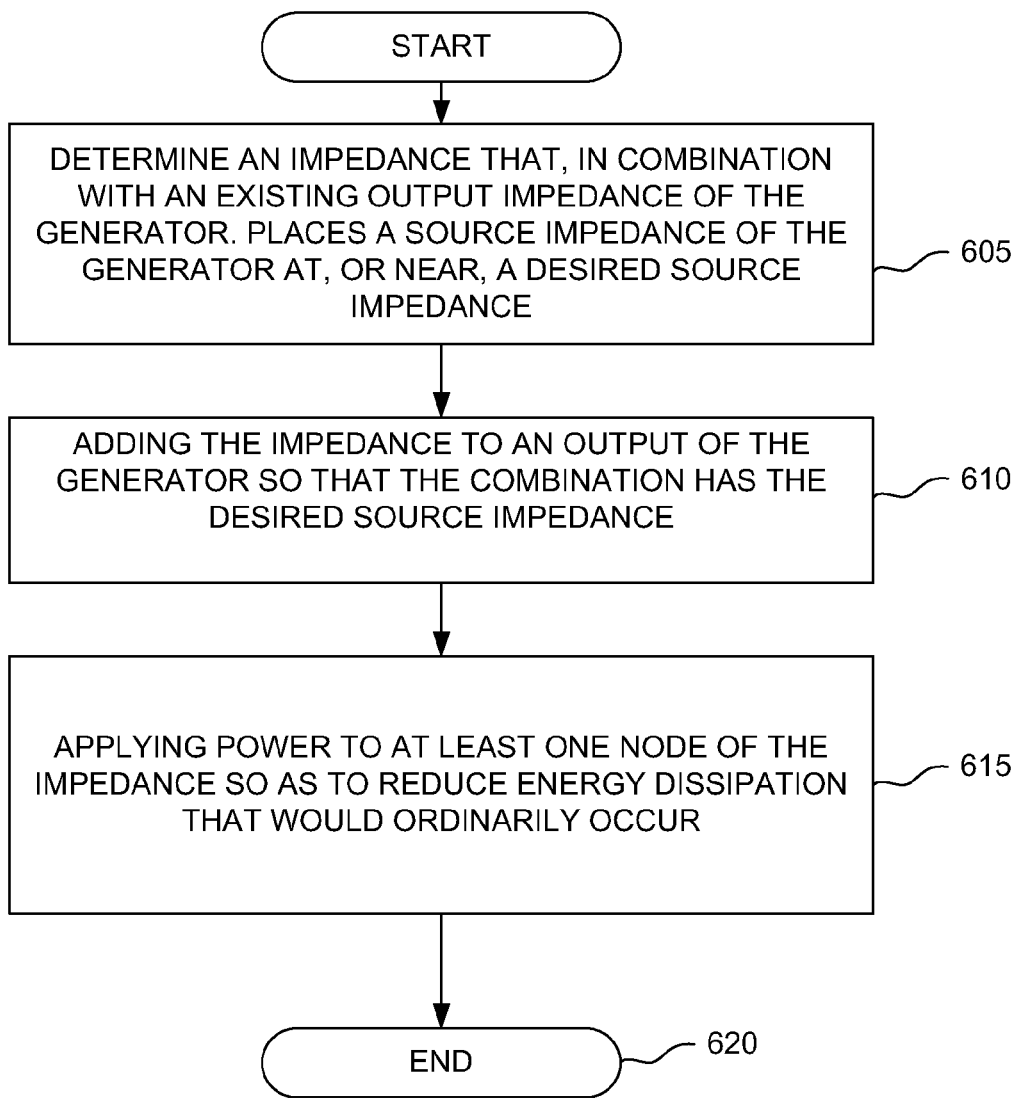
FIG. 6 is a flowchart of a method for stabilizing interactions between a generator and a nonlinear load in accordance with an embodiment of the invention.

Referring next to FIG. 6, it is a flowchart of a method for modifying a source impedance of a generator while reducing energy loss. As shown, a determination is made as to what added impedance (e.g., parallel or series), in combination with an existing output impedance of the generator, renders the source impedance of the generator at, or near, a desired source impedance (Block 605), and that additional impedance is then added to the output of the generator so that the combination has the desired source impedance (Block 610). In many implementations, the impedance of the cable and the match are considered to be a part of the generator output impedance for purposes of determining what impedance should be added to the output of the generator, and it is contemplated that an additional impedance may be added to the output of the generator and then the source impedance may be adjusted (e.g., "fine tuned"), if need be, by changing a length of the cable.

As shown in FIG. 6, power is then applied to the impedance so as to reduce (e.g., decrease or eliminate) energy dissipation that would ordinarily occur (Block 615). For example, either a voltage is applied to the impedance or a current is placed across the impedance that keeps dissipation (e.g., within a defined bandwidth) at or close to zero.

In conclusion, the present invention provides, among other things, a method and apparatus for stabilizing interactions between an electrical generator and a nonlinear load while reducing energy loss. Those skilled in the art can readily recognize that numerous variations and substitutions may be made in the invention, its use, and its configuration to achieve substantially the same results as achieved by the embodiments described herein. Accordingly, there is no intention to limit the invention to the disclosed exemplary forms. Many variations, modifications, and alternative constructions fall within the scope and spirit of the disclosed invention as expressed in the claims.

What is claimed is:

1. A system for stabilizing power that is applied from a generator to a non-linear load, comprising:
    an impedance element coupled to an output of the generator; and
    a power source coupled to the impedance element at a first node and arranged in series with the impedance element so that the impedance element is disposed between the output of the generator and the power source, and the impedance element and the power source create a series combination that is in parallel with the generator, the power source applies a voltage to the first node that is substantially the same as a voltage at the output of the generator so as to reduce power dissipated in the impedance element.

2. The system of claim 1, including a control component that controls, responsive to the voltage at the output of the generator, the voltage that the power source applies to the first node.

3. The system of claim 2, wherein the control component controls the power source to apply the voltage to the first node within a bandwidth so that outside of the bandwidth, the impedance element helps to stabilize an interaction between the generator and the non-linear load.

4. The system of claim 3, wherein the bandwidth is less than 1 kHz.

5. The system of claim 1, wherein the power source includes a switch-mode power supply.

6. The system of claim 1, wherein the power source is configured to modulate the phase, frequency, and the amplitude of the voltage that is applied to the first node.

7. The system of claim 1, wherein the impedance element and the power source are positioned within a housing of the generator.

8. A method for stabilizing an interaction between a generator and a non-linear load;
    placing an impedance element between an output of the generator and a power source so that the source impedance of the generator in parallel with the impedance element in series with the power source is substantially the same as the non-linear load impedance; and adjusting the power source output so as to reduce the power dissipated by the impedance.

9. The method of claim 8, wherein applying power includes applying a voltage to the impedance that is substantially the same as a voltage that is output by the generator so as to reduce a current flowing through the impedance.

10. The method of claim 8, including:
controlling the application of power responsive to changes in the impedance of the non-linear load.

11. The method of claim 10, wherein the controlling the application of power is responsive to the changes in the impedance of the non-linear load occurring at a frequency that falls into a certain frequency range.

12. The method of claim 10, including:
monitoring one of a voltage or a current or a combination thereof at the output of the generator, wherein the changes in the impedance of the non-linear load are indicated by the monitoring.

13. The method of claim 8, wherein the generator is a radio-frequency generator.

14. The method of claim 8, wherein the nonlinear load includes a plasma.

15. The method of claim 8, including controlling the power source within a bandwidth;
measuring the impedance of the nonlinear load; and
controlling, based upon the impedance of the nonlinear load, the generator so as to prevent instability of the output power that would otherwise result due to interactions between the electrical generator and the impedance of the nonlinear load inside of the bandwidth.

16. An apparatus for stabilizing power that is applied from a generator to a non-linear load while reducing energy loss through an impedance that is coupled to the generator, comprising:
a sensor that senses at least one characteristic of the power that is applied from the generator to the non-linear load; and
an energy loss mitigation component that, responsive to the sensed characteristic of power, reduces energy loss that would ordinarily occur due to energy dissipation through the impedance.

17. The apparatus of claim 16, wherein the at least one characteristic of the power includes a voltage.

18. The apparatus of claim 16, wherein the at least one characteristic of the power includes current.

* * * * *